United States Patent [19]

Pankove

[11] Patent Number: 4,979,002
[45] Date of Patent: Dec. 18, 1990

[54] OPTICAL PHOTODIODE SWITCH ARRAY WITH ZENER DIODE

[75] Inventor: Jacques I. Pankove, Boulder, Colo.

[73] Assignee: University of Colorado Foundation, Inc., Boulder, Colo.

[21] Appl. No.: 404,701

[22] Filed: Sep. 8, 1989

[51] Int. Cl.$^5$ ............................................. H01L 33/00
[52] U.S. Cl. ........................................ 357/17; 357/16; 357/19; 357/30; 357/38; 357/13
[58] Field of Search ................... 357/16, 17, 19, 30 P, 357/30 E, 30 G, 30 L, 30 O, 38 LA, 13, 38

[56] References Cited

U.S. PATENT DOCUMENTS

| | | | |
|---|---|---|---|
| 3,938,172 | 2/1976 | Lockwood | 357/18 |
| 3,939,172 | 2/1976 | Lockwood | 357/18 |
| 4,152,713 | 5/1979 | Copeland et al. | 357/19 |
| 4,316,156 | 2/1982 | Scifres et al. | 357/17 X |
| 4,399,448 | 8/1983 | Copeland | 357/17 X |

OTHER PUBLICATIONS

Copeland et al, "P14 N-P-N Optical Detectors and Light-Emitting Diodes," *IEEE Journal of Quantum Electronics*, vol. QE-14, No. 11, Nov. 1978, pp. 810–813.

Pankove et al, "A PNPN Optical Switch," SPIE, vol. 963, Optical Computing 88 (1988), pp. 191–196.

K. Kubota et al, "Optical Crossbar interconnection Using Vertical-to-Surface Transmission Electro-Photonic Devices (VSTEP)", published SPIE, vol. 963, Optical Computing 88 (1988), pp. 255–259.

*Primary Examiner*—William Mintel
*Attorney, Agent, or Firm*—Donald S. Cohen; Earl C. Hancock

[57] ABSTRACT

An optical switching array includes a body of a semiconductor material having opposed surfaces. A plurality of spaced bodies of a semiconductor material are on one of the surfaces of the substrate. Each body includes four superimposed regions extending thereacross with the regions being of alternating opposite conductivity type to form PN junctions between adjacent regions. The bodies are capable of emitting light in response to an optical input when an electrical bias is applied thereacross. A fifth region extends across each body and forms a Zener diode with one of the outer region of the body. The Zener diode is adapted to limit the voltage drop across the bodies when one of the bodies is biased to emit light so as to permit more than one body to be turned to its light emitting condition at any one time.

18 Claims, 3 Drawing Sheets

OPTICAL PHOTODIODE SWITCH ARRAY WITH ZENER DIODE

FIELD OF THE INVENTION

The present invention relates to an array of optical switches, and, more particularly to an array of light emitting devices which are operated optically and which will allow one or more of the devices to be selectively turned on at one time.

BACKGROUND OF THE INVENTION

A semiconductor light emitting device, in general, is a body of a semiconductor material which when biased emits light, either visible or infrared, through the recombination of pairs of oppositely charged carriers Such devices generally include regions of opposite conductivity types forming a PN junction therebetween. When the junction is properly biased, charge carriers of one conductivity type are injected from one of the regions into the other where the predominant charge carriers are of the opposite conductivity type so as to achieve the light generating recombination.

An optical switch is an optoelectronic device that emits light in response to an optical input while an electrical bias is applied. One type of an optical switch is a body of a semiconductor material having four regions of alternating opposite conductivity type, i.e. PNPN or NPNP. Preferably the two interior regions are made of a direct-gap semiconductor material while the outer two regions are made of a wider-band-gap material. Such an optical switch is disclosed in U.S. Pat. No. 4,152,713 to John A Copeland, III et al, issued May 1, 1979 entitled UNIDIRECTIONAL OPTICAL DEVICE AND REGENERATOR. For certain types of optical communication or signal processing systems it is desirable to have an array of optical switches in which one or more of the switches can be selectively operated at one time. Although a plurality of the optical switch devices can be mechanically mounted together in an array, such an array would be relatively large and expensive to make. It is also possible to form an array of these optical switches on a single substrate to form a much smaller array. However, it has been found that such an array has a major problem. When one of the switching devices of the array is turned on by a light source, the voltage across all of the switching devices of the array will drop to a holding voltage. This holding voltage is low enough so that none of the other switching devices can be turned on. Thus, this type of an array is limited to having only one device turned on at a time. Therefore, it would be desirable to have an array of the switching devices in which one or more of the switching devices can be selectively turned on at any one time.

SUMMARY OF THE INVENTION

The present invention relates to an optical switching device which includes a body of a semiconductor material having therein four regions which form two outer regions and two inner regions with adjacent regions contacting each other. The regions are of alternating opposite conductivity type so that adjacent regions form PN junctions therebetween and are adapted to emit light in response to an optical input when an electrical bias is applied across the regions. The switching device is provided with means for limiting the voltage drop across the regions when the switching device is biased to its light emitting condition. Such a means preferably comprises a fifth region which extends across and is contiguous with one of the outer regions. The fifth region is of a conductivity type opposite that of the one outer region to form a Zener diode therewith.

DETAILED DESCRIPTION OF PREFERRED EMBODIMENT

Figure 1:
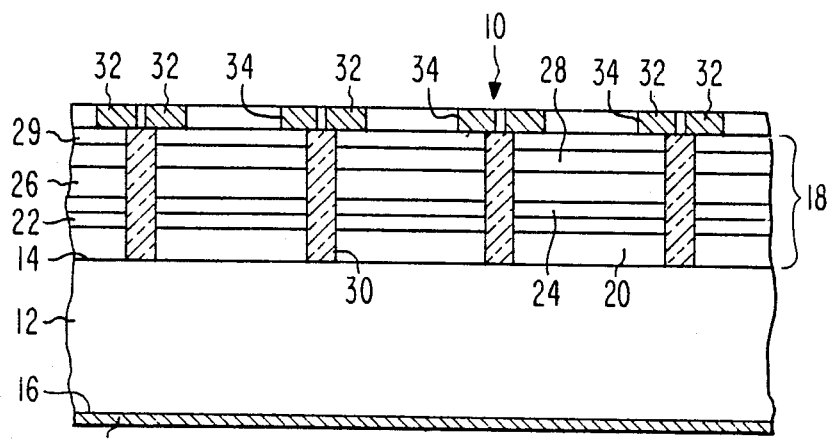
FIG. 1 is a sectional view of one form of the optical switching array of the present invention.

Referring to FIG. 1, there is shown one form of the optical switching array 10 of the present invention. The switching array 10 comprises a substrate 12 of a semiconductor material having a pair of opposed surfaces 14 and 16. On the surface 14 of the substrate 12 are a plurality of spaced bodies 18, each forming an optical switch. Each of the bodies 18 comprises four regions 20, 22, 24 and 26 of a semiconductor material superimposed on each other and extending across the body 18. The regions 20, 22, 24 and 26 are of alternating conductivity type so that adjacent regions form PN junctions therebetween. For example, if the region 20, which is directly on the substrate surface 14, is of N-type conductivity, the next region 22 would be of P-type conductivity, the next region 24 would be of N-type conductivity and the next region 26 would of P-type conductivity. This forms an NPNP optical switch. Alternatively, the regions could be of the opposite conductivity type to form a PNPN optical switch. The outer two regions 20 and 26 are of a wider energy band-gap material, such as aluminum gallium arsenide (AlGaAs) and the two inner regions 22 and 24 are of a direct narrower energy band-gap material, such as gallium arsenide (GaAs). Thus, the two inner regions 22 and 24 form a homojunction with each other, and each of the outer regions 20 and 26 forms a heterojunction with its adjacent inner region 22 and 24 respectively.

On the outer region 26 of the optical switch is a resistance means for controlling the potential drop across the region 26. Preferably, the resistance means comprises a region 28 of a semiconductor material of a conductivity type opposite to that of the region 26 so as to form a PN junction therewith. Thus, if the region 26 is of P-type conductivity, the region 28 is of N-type conductivity. The region 28 is preferably of the same semiconductor material as the region 26 and is doped so as to form a Zener diode with the region 26. However, other types of resistance means can be used instead of a Zener diode.

The substrate 12 is of any semiconductor material which is compatible with the semiconductor materials of the body 18 in that it allows the body 18 to be easily formed on the substrate. For example, the substrate 12 can be made of gallium arsenide (GaAs). Also, the substrate 12 is of the same conductivity type as that of the region 20 and is highly conductive. Thus, if the region 20 is of N-type conductivity, the substrate would be of N+ type conductivity.

The bodies 18 are electrically and optically isolated from each other by regions 30 of an electrically insulating and light-absorbing material which extends between adjacent bodies 18. The isolation regions 30 may be of amorphous silicon or chromium doped gallium arsenide. On the region 28 is a thin capping layer 29 of the same material and conductivity type as the substrate 12. On the surface of the capping layer 29 and over each of the bodies 18 is a separate layer 32 of a conductive material which makes ohmic contact to the region 28. The contact layers 32 each has a separate opening 34 therethrough over each of the bodies 18 to allow light to enter and exit the body 18. If the capping layer 29 is not light transmissive, it can also be provided with an opening therethrough in alignement with the opening 34 in the contact layer 32. A layer 36 of a conductive material extends over the surface 16 of the substrate 12 and makes ohmic contact thereto. The contact layers 32 and 36 may be of any conductive material or system of conductive materials which adheres well and makes ohmic contact to the particular material of the region or substrate on which it is applied. For 30 example, for an N+ material, a system of a first layer of nickel coated with a layer of a gold-germanium alloy and finally coated with a gold layer is suitable. For a P-type conductivity material, a layer of gold is suitable.

In the operation of the optical switching array 10, a voltage is applied across each of the bodies 18 between the contact layers 32 and 36 in a direction so as to reverse bias the PN junction between the two inner regions 22 and 24 and to forward bias each of the PN junctions between the outer regions 20 and 26 and its respective inner region 22 and 24. If the applied voltage is increased high enough, breakdown will result from either avalanching (when a critical field is exceeded at the reverse-biased junction), or from punch-through (when a depletion layer extends to the nearest forward-biased heterojunction). After such a breakdown, double injection occurs, which floods the two inner regions 22 and 24 with electrons and holes that are stopped by the potential barriers at the heterojunctions between each of the inner regions 22 and 24 and its adjacent outer region 20 and 26. This results in the generation of light in the body 18. The light is emitted from the bodies 18 through the openings 34 in the contact layer 32.

However, in the optical switching array 10 of the present invention, the voltage applied across the bodies 18 is at a level just below that which will cause breakdown. Light is then directed at at least one of the bodies 18 through an opening 34 in the contact layer 32. The photons from the light are absorbed in the inner regions 22 and 24 inducing the breakdown. The presence of a high electric field in the junction lowers the photon energy to which the device is sensitive; this is the Franz-Keldysh effect. Essentially, the absorbed photons produce electron-hole pairs that are separated by the electric field. These charges accumulate on either side of the PN junction, lowering the potential barrier to the injection of carriers from the outer regions 20 and 26. This results in double-injection and light is generated in the body 18. The sensitivity of the device to the exciting light can be adjusted by the voltage applied across the body 18.

Figure 4:
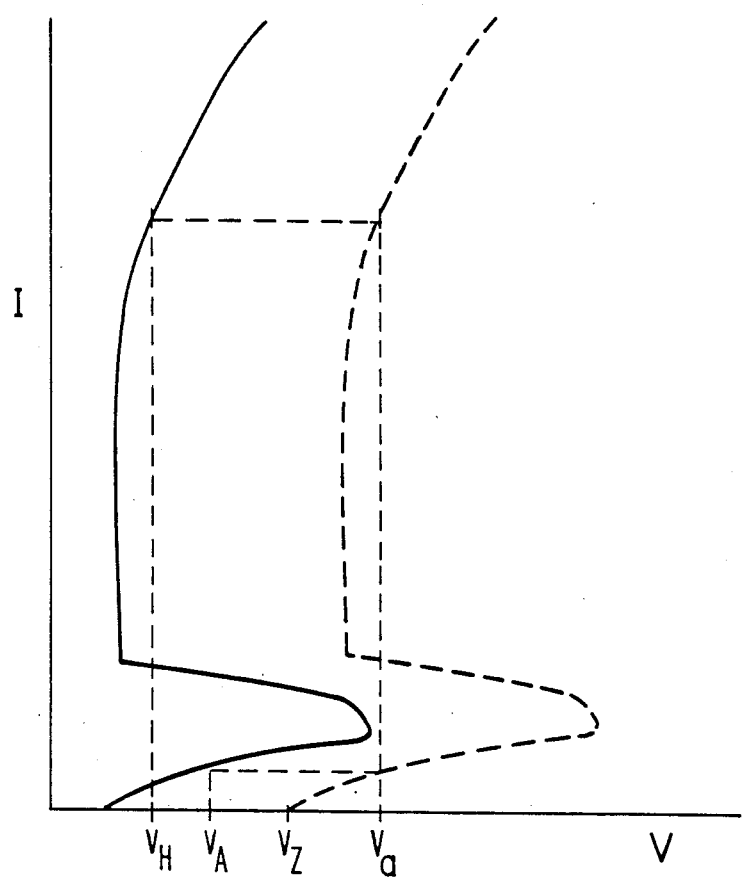
FIG. 4 is a current vs voltage (IV) diagram for the array of the present invention.

The Zener diode formed by the region 28 and the outer region 26 breaks down at a critical voltage determined by the doping of the regions. Beyond breakdown, the voltage across the Zener diode is clamped at a constant value while the current increases. Thus, when there is breakdown across one of the switches resulting in the switch being turned into the ON or light emitting mode, most of the applied potential appears across the Zener diode as shown in FIG. 4. Since the voltage across the Zener diode becomes clamped at a constant voltage, the voltage across each of the switches does not drop, but stays at a constant level at which it can be turned on by light being directed at the switch. Therefore, in the switching array 10 of the present invention, turning ON one of the switches does not prevent the others from being turned ON since the Zener diode holds the voltage at a level at which the other switches can be turned ON by light being directed at the switch. Thus, in the switching array 10 of the present invention more than one switch can be selectively turned ON to emit light at any one time. If desired, light pipes or optical fibers can be placed over each opening 34 in the contact layer 32 to direct light into and out of each switch body 18.

Figure 2:
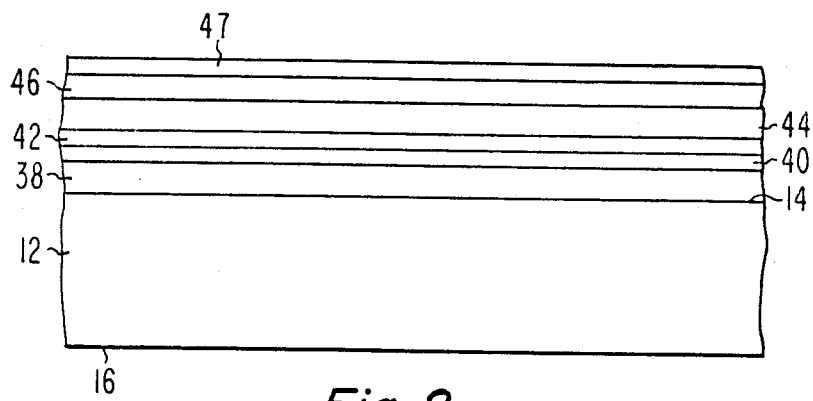
FIGS. 2 and 3 are sectional views illustrating the steps of one method of making the array of FIG. 1.
Figure 3:
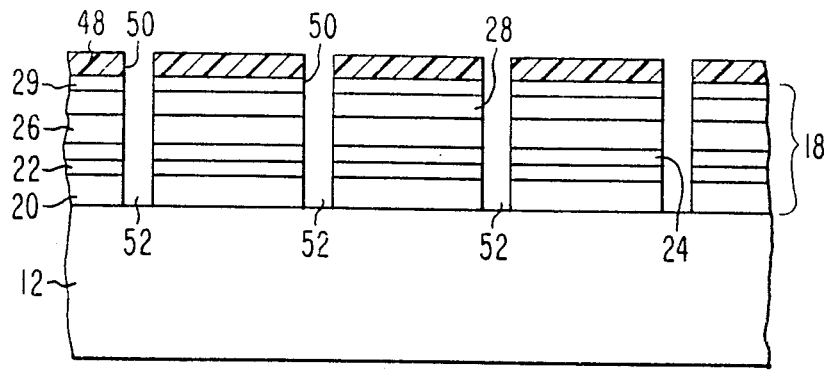

As shown in FIG. 2, the switching array 10 may be made by depositing five layers 38, 40, 42, 44, 46 and 47 in succession on the surface 14 of a substrate 12. The layers 38, 40, 42, 44, 46 and 47 are of the semiconductor material and conductivity type as the regions 20, 22, 24, 26, 28 and 29 respectively. The layers may be deposited by any well known epitaxial deposition technique, such as liquid phase epitaxy (LPE), metal organic chemical vapor deposition (MOCVD) or molecular beam epitaxy (MBE). As shown in FIG. 3, a masking layer 48, such as of a photoresist, is applied over the layer 47 and is defined, such as by the well known technique of photolithography, to provide it with openings 50 therein where the isolation regions are to be formed. Trenches 52 are then etched through the exposed portions of the layers to the substrate surface 14, such as by plasma etching. The trenches 52 are then filled with the isolation material to form the isolation regions 30. The trenches 52 may be filled with amorphous silicon by deposition from a plasma in silane or disilane or with chromium doped GaAs by liquid phase epitaxy. The surface of the layer 47 and the isolation material is then lapped flat and the contact layers 32 and 36 are applied. The contact layer 32 is provided with the openings 34 by masking the metal layer except where the openings 34 are to be formed, and etching away the unprotected portions of the contact layer 32.

Figure 5:
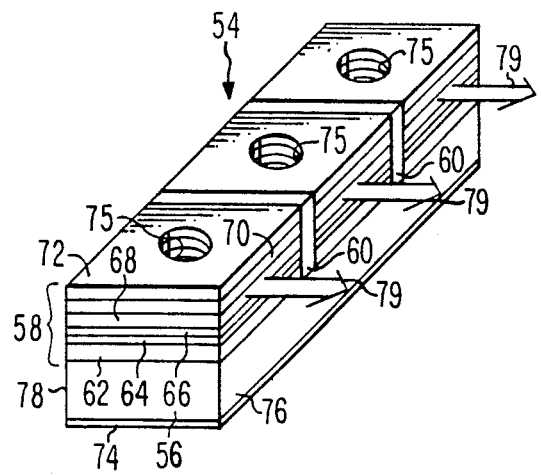
FIG. 5 is a perspective view of another form of the optical switching array of the present invention.

The switching array of the present invention can also be in the form of a linear array of semiconductor lasers. Referring to FIG. 5, there is shown a linear switching array 54 of semiconductor lasers. The linear switching array 54 comprises a substrate 56 similar to the substrate 12 of the array 10 of FIG. 1. On the substrate 56 are a plurality of semiconductor laser bodies 58 arranged in a line and electrically and optically isolated from each other by regions 60 of an electrically insulating and light absorbing material, similar to the isolation regions 30 of the array 10. Each semiconductor laser body 58 is formed of four superimposed regions 62, 64, 66 and 68 of semiconductor material of alternating opposite conductivity types. The regions 62, 64, 66 and 68 are similar to the regions 20, 22, 24 and 26 of the array 10 in that the outer two regions 62 and 68 are of a wider energy band-gap material, and the two inner regions 64 and 66 are of a narrower energy band-gap material. Thus, there is provided a heterojunction between each of the outer regions 62 and 68 and its adjacent inner region 64 and 66 respectively which will confine the charge carriers generated in the body 58 as well as the light generated by the recombination of the charge carriers.

A fifth region 70 is on the outer region 68 and is of a conductivity type opposite that of the outer region 68 to form a Zener diode therewith. A separate conductive contact 72 is on the fifth region 70 of each body 58, and a conductive contact 74 is on the surface of the substrate 56 opposite the bodies 58. Each of the contacts 72 has an opening 75 therethrough to allow light to enter into the body 58. The opposite end surfaces 76 and 78 of the bodies 58 are made reflective, such as by being cleaved, with at least one of the end surfaces 76 and 78 being partially transparent to allow some light to pass therethrough.

The semiconductor laser switching array 54 operates in the same manner as described above with regard to the switching array 10 of FIG. 1 except that the light is emitted from one or both of the end surfaces 76 and 78 of the bodies 58 as indicated by the arrows 79. By providing a confining cavity in the inner regions 64 and 66 between the outer regions 62 and 68 with reflective end surfaces 76 and 78, the light can be emitted as a substantially collimated beam of light. As in the switching array 10, the Zener diode provided by the fifth region 70 and the outer region 68 provides a voltage of constant value across each of the bodies 58 so that the bodies 58 can be turned on either individually or in groups of two or more.

Figure 6:
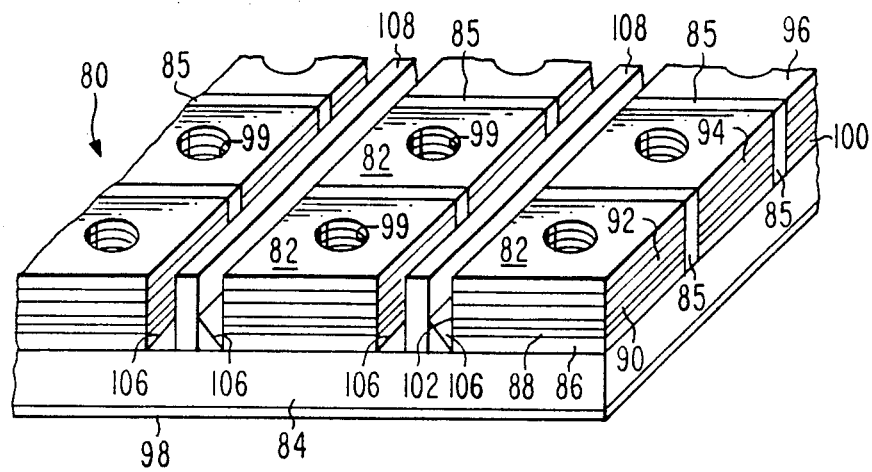
FIG. 6 is a perspective view of a portion of still another form of the optical switching array of the present invention.

The semiconductor laser switching array of the present invention can also be in the form of a two dimensional array 80 as shown in FIG. 6. The two dimensional array 80 comprises a plurality of semiconductor laser bodies 82 on the surface of a substrate 84 with the bodies 82 being arranged in a plurality of lines, such as in rows and columns. Adjacent bodies 82 in each column are electrically and optically isolated from each other by a region 85 of an electrically insulating and light absorbing material. The substrate 84 is similar to the substrate 12 of the switching array 10 of FIG. 1, and each of the bodies 82 is similar to the bodies 18 of the array 10. Each of the bodies 82 includes four superimposed regions 86, 88, 90 and 92 of a semiconductor material of alternating opposite conductivity type. The outer two regions 86 and 92 are of a material having a wider energy band-gap, and the two inner regions 88 and 90 are of a material having a narrower energy band-gap. Thus, there is provided a heterojunction between each of the outer regions 86 and 92 and its adjacent inner region 88 and 90 respectively for confining the generated charge carriers and the light resulting from the recombination of the charge carriers.

A fifth region 94 is on the outer region 92 and is of a conductivity type opposite that of the outer region 92 to form a Zener diode therewith. A separate conductive contact 96 is on each of the fifth regions 94, and a conductive contact 98 is on the surface of the substrate 84 opposite the bodies 82. Each of the contacts 96 has an opening 99 therethrough to allow light to pass into the bodies 82. The opposite end surface 100 and 102 of each body 82 is partially reflective, and at least one of the end surfaces 100 and 102 is partially transparent to allow some of the light generated in the body 84 to be emitted therethrough. A space is provided between the end surfaces 100 and 102 of the bodies 84 of adjacent columns of the bodies and means is provided across the end surfaces 100 and 102 to deflect the emitted light away from the substrate 84. As shown in FIG. 6, the deflecting means is a mirror surface 106 facing the end surface 100 and 102 of each body 82 and at an angle to deflect the light emitted from the end surface away from the substrate 84. The mirror surfaces 106 may be formed from portions of the semiconductor material of the bodies 82 which remain when the spaces are formed between the bodies 82 by etching away a portion of the bodies 82. If desired, each of the mirror surfaces 106 may be coated with a metal layer to make them more reflective. However, other types of deflecting means, such as a Bragg reflector formed in a portion of the semiconductor material adjacent the end surfaces 100 and 102 may be used. If desired, an isolation region 108 of the same material as the isolation regions 85 may be provided between the mirrors 106 to prevent light emitted from the end surface 100 and 102 from passing into the adjacent body 82 within the row.

The semiconductor laser switching array 80 operates in the same manner as the switching array 54 of FIG. 5 described above. However, in the switching array 80, the light beam emitted from one or both ends of each body 82 is reflected away from the substrate and substantially perpendicular to the surface of the array. The Zener diodes formed between the fifth regions 94 and the outermost region 92 of the bodies 82 provide a voltage of constant value across the bodies 82 so that either one or a plurality of the bodies 82 can be turned ON independently.

Although in each of the switching arrays of the present invention, the region forming the Zener diode is shown as being over the top outermost region of the switching bodies, it can be formed directly on the substrate surface with the switching bodies being formed thereover. Also, although the regions of the body have been described as being formed of aluminum galium arsendie and gallium arsenide, other semiconductor materials having the proper band-gap and lattice constant can be used, such as, for example, indium gallium arsenide and indium phosphide. Thus, there is provided by the present invention, an optical switching array in which each switching body 18 includes a Zener diode to clamp the voltage across the switching bodies at a constant value when one of the switches is turned ON. This allows other of the switches to be turned on by light being directed therein so that more than one of the switches can be selectively turned ON at any one time.

What is claimed is:

1. An optical switching device comprising:
    a body of a semiconductor material having four regions extending thereacross forming two outer regions and two inner regions with adjacent regions being in contact with each other, said regions being of alternating opposite conductivity type so that adjacent regions form PN junctions therebetween, said regions being capable of emitting light in response to an optical input when an electrical bias is applied across the regions; and
    a fifth region extending across and contiguous with one of the outer regions, said fifth region being of a conductivity type opposite that of the one outer region and forming a Zener diode therewith for limiting the voltage drop across the regions when the switching device is biased to its light emitting condition.

2. An optical switching device in accordance with claim 1 in which the inner two regions of the body are of a first direct energy band-gap material and the outer two regions are of a second energy band-gap material that is wider than the first energy band-gap.

3. An optical switching device in accordance with claim 2 in which the inner two regions are of the same material to form a homojunction therebetween and the outer two regions are of a material different from that of the inner two regions to form a heterojunction between each of the outer regions and its adjacent inner region.

4. An optical switching array comprising:
a substrate having a pair of opposed surfaces;
a plurality of spaced bodies on one of said substrate surfaces, each of said bodies having four regions extending thereacross forming two outer regions and two inner regions with adjacent regions being in contact with each other, said regions being of alternating opposite conductivity type so that adjacent regions form PN junctions therebetween, said regions being capable of emitting light in response to an optical input when an electrical bias is applied across the regions; and
a separate fifth region extending across one of the outer regions of each of the bodies, said fifth region being of a conductivity type opposite to that of the one outer region and forming a Zener diode therewith for limiting the voltage drop across the bodies when one of the bodies is biased to a light-emitting condition.

5. An optical switching array in accordance with claim 4 in which the inner two regions of each body are of a first direct energy band-gap material and the outer two regions of each body are of a second energy band-gap material that is wider than the first energy band-gap.

6. An optical switching array in accordance with claim 5 in which the inner two regions of each body are of the same material to form a homojunction therebetween and the two outer regions of each body are of a material different from that of the inner regions to form a heterojunction between each of the outer regions and its adjacent inner region.

7. An optical switching array in accordance with claim 5 including means between adjacent bodies electrically and optically isolating the bodies from each other.

8. An optical switching array in accordance with claim 7 in which the isolation means comprises a region of an electrically insulating and light absorbing material.

9. An optical switching array in accordance with claim 7 in which the substrate is of a semiconductor material of the same conductivity type as the region of the surface thereof but of higher conductivity.

10. An optical switching array in accordance with claim 9 including a contact layer of a conductive material over the outermost region of the bodies, said contact layer having a separate opening therethrough over each of said bodies.

11. An optical switching array in accordance with claim 9 including a contact layer of a conductive material over the other surface of the substrate.

12. An optical switching array in accordance with claim 9 in which the fifth region is on the side of each body opposite the substrate.

13. An optical switching array in accordance with claim 9 in which the fifth region is between the surface of the substrate and the body.

14. An optical switching array in accordance with claim 7 in which the bodies are arranged in a line and have opposed end surfaces, said end surfaces being reflective with at least one of said end surfaces being partially transparent to allow light to be emitted therefrom, a conductive layer on the fifth layer of each body and a conductive region on the other surface of the substrate.

15. An optical switching array in accordance with claim 14 including means at the end surface of each body from which light is emitted to deflect the light in a direction away from the substrate.

16. An optical switching array in accordance with claim 15 in which the deflection means is a mirror extending across and at an angle with respect to said body end surface.

17. An optical switching array in accordance with claim 15 including a plurality of lines of said bodies on said substrate with spaces between the end surfaces of the bodies of adjacent lines, and the reflective means is in the spaces between the lines of bodies.

18. An optical switching array in accordance with claim 17 in which the reflective means comprises a portion of the semiconductor material having a reflective surface extending across and at an angle to the end surface of the body.

* * * * *